United States Patent [19]

Lowrey et al.

[11] Patent Number: 5,032,530
[45] Date of Patent: Jul. 16, 1991

[54] SPLIT-POLYSILICON CMOS PROCESS INCORPORATING UNMASKED PUNCHTHROUGH AND SOURCE/DRAIN IMPLANTS

[75] Inventors: Tyler A. Lowrey; Randal W. Chance; Ward D. Parkinson, all of Boise, Id.

[73] Assignee: Micron Technology, Inc., Boise, Id.

[21] Appl. No.: 427,639

[22] Filed: Oct. 27, 1989

[51] Int. Cl.$^5$ .......................................... H01L 21/265
[52] U.S. Cl. ........................................ 437/34; 437/44; 437/56; 437/57; 437/233; 437/41; 357/42; 357/44
[58] Field of Search ................. 437/40, 41, 44, 34, 437/56, 57, 233; 357/41, 42, 44, 59 G

[56] References Cited

U.S. PATENT DOCUMENTS

| 4,745,086 | 5/1988 | Parrillo et al. | 437/44 |
| 4,753,898 | 6/1988 | Parrillo et al. | 437/34 |

FOREIGN PATENT DOCUMENTS

| 0058386 | 5/1979 | Japan | 437/44 |
| 0017164 | 1/1982 | Japan | 437/34 |
| 0213051 | 10/1985 | Japan | 437/44 |
| 0165355 | 7/1987 | Japan | 437/233 |
| 0132155 | 5/1989 | Japan | 437/34 |

OTHER PUBLICATIONS

Tsang et al., "Fabrication of High-Performance LDDFET's with Oxide Sidewall-Spacer Technology", IEE Trans. on Electron Devices, vol. ED-29, No. 4, Apr. 1982, pp. 590–596.

Primary Examiner—Olik Chaudhuri
Assistant Examiner—M. Wilczewski
Attorney, Agent, or Firm—Angus C. Fox, III; Stanley N. Protigal

[57] ABSTRACT

An improved CMOS fabrication process which uses separate masking steps to pattern N-channel and P-channel transistor gates from a single layer of conductively-doped polycrystalline silicon (poly). The object of the improved process is to reduce the cost and improve the reliability and manufacturability of CMOS devices by dramatically reducing the number of photomasking steps required to fabricate transistors. By processing N-channel and P-channel devices separately, the number of photomasking steps required to fabricate complete CMOS circuitry in a single-polysilicon-layer or single-metal layer process can be reduced from eleven to eight. Starting with a substrate of P-type material, N-channel devices are formed first, with un-etched poly left in the future P-channel regions until N-channel processing is complete. The improved CMOS process provides the following advantages over conventional process technology. Use of a masked high-energy punch-through implant for N-channel devices is not required; individual optimization of N-channel and P-channel transistors is made possible; a lightly-doped drain (LDD) design for both N-channel and P-channel transistors is readily implemented; source/-drain-to-gate offset may be changed independently for N-channel and P-channel devices; and N-channel and P-channel transistors can be independently controlled and optimized for best LDD performance and reliability.

3 Claims, 9 Drawing Sheets

SPLIT-POLYSILICON CMOS PROCESS INCORPORATING UNMASKED PUNCHTHROUGH AND SOURCE/DRAIN IMPLANTS

FIELD OF THE INVENTION

This invention describes a process sequence for the fabrication of Complimentary Metal Oxide Semiconductor (hereinafter "CMOS") integrated circuits. More specifically, it relates to the fabrication of high-performance transistors in a split-polysilicon process.

BACKGROUND OF THE INVENTION

Although CMOS integrated circuit devices are often referred to as "semiconductor" devices, such devices are fabricated from various materials which are either electrically conductive, electrically nonconductive or electrically semiconductive. Silicon, the most commonly used semiconductor material can be made conductive by doping it with either an element such as boron which has one less valence electron than silicon, or with an element such as phosphorus or arsenic which have one more valence electron than silicon. In the case of boron doping, electron "holes" become the charge carriers and the doped silicon is referred to as positive or P-type silicon. In the case of phosphorus or arsenic doping, the additional electrons become the charge carriers and the doped silicon is referred to as negative or N-type silicon. Silicon is used either in single-crystal or polycrystalline form. Polycrystalline silicon is referred to hereinafter as "polysilicon" or simply as "poly". Originally, MOS devices were manufactured from metal (used as the transistor gate), semiconductor material (used as the transistor channel material), and oxide (used as the dielectric between the gate and the substrate. Currently, however, most MOS transistors are fabricated using a conductively-doped polycrystalline silicon layer for the gate material. Another dielectric, such as silicon nitride, could readily be utilized as a replacement for the standard oxide dielectric.

CMOS processes begin with a lightly-doped P-type or P-type silicon substrate. For the sake of simplicity, the prior art CMOS process will be described using P-type silicon as the starting material. If N-type silicon were used, the process steps would be virtually identical, with the exception that in some cases, dopant types would be reversed. Fabrication of sub-micron CMOS devices with a single poly layer and a single metal layer using prior art technology generally requires at least 11 photoresist masks (or simply "photomasks") to create N-channel and P-channel transistors on a silicon substrate (an additional one or two masks is required if lightly-doped drain design is required for both types of transistors). The function of these 11 masks is described below.

The first photoresist mask is used to define N-wells. This is done by creating a first layer of pad oxide on a lightly-doped P-type substrate, depositing a layer of nitride on top of the pad oxide, masking the nitride layer to expose certain regions which are then implanted with arsenic or phosphorus to create the N-wells. The N-well regions are then oxidized using a first conventional LOCOS (LOCal Oxidation of Silicon) step to create a silicon oxide layer to protect them from an optional boron implant which adjusts the concentration of the P-type substrate for the N-channel devices. During the LOCOS process, the pad oxide serves as a stress relief layer. Alternatively, an oxide deposition or oxide growth step could replace the first LOCOS step, eliminating the need for the first pad oxide layer and the first nitride layer. A subsequent high-temperature drive step is used to achieve the desired N-well junction depth. Following removal of the oxide layer, a second layer of pad oxide is grown over the entire wafer. A second silicon nitride layer is then deposited on top of the pad oxide layer.

The second photomask is used to pattern portions of the second silicon nitride layer which define the future active areas on the wafer.

The third photomask is used to cover the N-well regions in order to effect a selective boron field-isolation implant. Following the stripping of the third photomask, the regions on the wafer that are not protected by the remaining portions of the second silicon nitride layer are oxidized to form field oxide regions using a second conventional LOCOS step. The nitride layer is then stripped, as is the pad oxide layer. A layer of sacrificial oxide is then grown to eliminate the "white ribbon" or Kooi effect in the active areas that follows field oxidation. An unmasked implant may be used as a threshold voltage ($V_T$) adjustment.

The fourth photomask exposes only the channel regions of the N-channel transistors to a high-energy boron punch-through implant. This implant increases both source-to-drain breakdown voltage and the threshold voltage, thus avoiding the short-channel effects which are inherent to nonimplanted, sub-micron N-channel devices. Following the punch-through implant, the fourth photomask is stripped, as is the sacrificial oxide layer. A layer of gate oxide is then grown on all active areas, following which a polysilicon layer is deposited on top of the gate oxide using conventional means (e.g., chemical vapor deposition). The poly layer is then doped with phosphorus.

The fifth photomask patterns the polysilicon layer to form the gates of both P-channel and N-channel transistors. Stripping of the fifth photomask is followed by a source/drain oxidation.

The sixth photomask is used to expose only the N-channel source and drain regions to a relatively low-dosage phosphorus implant which creates lightly-doped N− regions. Following the stripping of the sixth mask, a layer of silicon dioxide is deposited on the wafer. An anisotropic etch and a subsequent optional isotropic etch of the silicon dioxide layer form oxide spacers on the sides of each N-channel and P-channel transistor gate.

The seventh photomask exposes the N-channel source and drain regions to a relatively high-dosage phosphorus or arsenic implant which creates the heavily-doped N+ regions. Following the stripping of the seventh mask, the wafer is optionally subjected to elevated temperature for the purpose of diffusing the N-channel implants.

The eighth photomask is used for the high-dosage implantation of either boron or boron difluoride, which creates heavily doped source and drain regions for the P-channel transistors. Following the stripping of the eighth mask, the transistors are fully formed. All structures are then covered by an isolation oxide layer, which may be doped with phosphorus, boron or both.

The ninth photomask is used to define contact vias which will pass through the isolation oxide layer to the poly structures or active area conductive regions below. A deposition of an aluminum metal layer follows.

The tenth photomask is used to pattern the aluminum layer for circuit interconnects. Using a blanket deposition process, the circuitry is covered with one or more passivation layers.

The eleventh photomask defines bonding pad openings which will expose bonding pad regions on the aluminum layer below. This completes the conventional single-poly, single-metal CMOS process.

The business of producing CMOS semiconductor devices is a very competitive, high-volume business. Process efficiency and manufacturability, as well as product quality, reliability, and performance are the key factors that will determine the economic success or failure of such a venture. Each new generation of CMOS devices generally has a density that is some four times as great as the generation which it replaced. If this increase in density is achieved with no increase in die size, device geometries must be more or less halved. As geometries shrink, each photolithographic step becomes more costly. The increase and cost may be attributed to a number of factors, including:

higher capital costs for precision "state-of-the-art" photolithographic equipment;

lowered yields and decreased reliability due to defect density increases invariably associated with each photomasking step;

an increase in the number of processing steps for each mask level, which slows the fabrication process and requires additional expensive equipment;

the requirement for ultra-clean fabrication facilities which are both expensive to construct and expensive to operate;

greater investment per wafer during fabrication, which increases the cost of scrapping defective devices; and costs associated with the step required subsequent to the masking step, whether it be an implant or an etch.

From the aforementioned discussion, it is evident that the elimination of photomasking steps from a CMOS process will have a direct impact on the cost, reliability, and manufacturability of the product.

A novel process is disclosed in the 1982 Japanese patent issued to Masahide Ogawa (No. 57-17164) for fabricating a CMOS integrated circuit by processing N-channel and P-channel devices separately. As with the conventional CMOS process, a single polysilicon layer is used to form both N-channel and P-channel gates. However, N-channel devices are formed first, with unetched polysilicon left in the future P-channel regions until N-channel processing is complete. The mask used to subsequently pattern the P-channel devices is also used to blanket and protect the already-formed N-channel devices. This process is herein referred to as the split-polysilicon CMOS process. The split polysilicon CMOS process, through largely ignored by semiconductor manufacturers in the U.S. and abroad, holds tremendous potential for reducing photomasking steps in a CMOS process.

SUMMARY OF THE INVENTION

The object of the present invention is to reduce the cost and improve the reliability and manufacturability of CMOS devices by implementing an improved CMOS fabrication process with a dramatically reduced number of photomasking steps.

The improved CMOS fabrication process is based on the aforementioned split-polysilicon CMOS process developed in Japan by Mashahide Ogawa. The improved process utilizes unmasked implants that are self-aligned to gate electrodes for high-performance N-channel transistors. These high-performance transistors have both punchthrough regions and LDD-type source/drain regions. By utilizing the split-polysilicon CMOS process in combination with the unmasked implants, the number of masks required to form both N-channel and P-channel devices can be reduced from eleven (for the standard CMOS process) to eight (for the improved process). However, N-channel devices are formed first, with unetched polysilicon left in the future P-channel regions until N-channel processing is complete. The function of each of the eight required photomasks is described below. For the sake of simplicity, the process will be described using P-type silicon as the starting material. If N-type silicon were used, the process steps would be virtually identical, with the exception that dopant types would be reversed in some cases.

The first photomask is used to form the N-well regions in a conventional manner.

The second photomask is used to conventionally define the active areas by patterning a nitride layer.

The third photomask is used to cover the N-well regions in order to effect the boron field isolation implant, also in accordance with conventional CMOS technology. Following the stripping of the third mask, LOCOS is used to grow the field oxide regions, and an unmasked boron implant is used as a transistor threshold enhancement. The use of a masked punch-through implant at this point is not required. Following the deposition and doping with phosphorus of a polysilicon layer, the process further deviates from convention.

The fourth photomask is used to pattern the gates of the N-channel transistors and to cover the P-channel regions. An anisotropic dry etch is used to form the N-channel transistor gates, following which the fourth mask photoresist is stripped. Following a blanket self-aligned boron punch-through implant, a source/drain oxidation is performed. A low-dosage blanket phosphorus implant then creates the lightly-doped N- regions of the N-channel sources and drains. Spacer oxide deposition is followed by an anisotropic dry etch and an optional isotropic etch (in that order), which leave spacers on both sides of the N-channel gates. Spacer formation is followed by a high-dosage blanket phosphorus or arsenic implant, which creates the heavily-doped N+ regions of the N-channel sources and drains. Doping of the poly layer in the P-channel regions with the aforementioned N-channel implants will have essentially no effect on P-channel transistor performance, since only the gate is affected, with the future source and drain regions remaining untouched.

The fifth photomask is used to pattern the gates of the P-channel transistors and to cover the N-channel regions. An isotropic dry etch is used to form the P-channel transistor gates, where the poly is purposely undercut (recessed under the patterning photoresist). Boron is then implanted in the regions not protected by the fifth photomask, thus creating P-doped sources and drains for the P-channel devices. The undercut P-channel gate offsets the P-channel source/drain implant such that implant diffusion related to subsequent temperature steps does not result in excessive P+ region-to-gate overlap. Following the removal of the fifth photomask, transistor formation, using the improved CMOS process, is complete.

The sixth, seventh, and eighth photomasks are used to complete the circuitry in a conventional manner, and correspond respectively to the ninth, tenth, and eleventh photomasks utilized for the previously-described conventional process.

The improved CMOS process provides the following advantages over conventional process technology:

It permits a dramatic reduction in the number of photomasking steps required in a modern high density CMOS process;

It is applicable to both low and high density (submicron) integration levels;

Use of a masked high-energy boron punch-through implant for N-channel transistors is not required (a blanket self-aligned implant after polysilicon deposition is used instead);

Individual optimization of N-channel and P-channel transistors is made possible;

It allows lightly-doped drain (LDD) design for both N-channel and P-channel transistors (the LDD design makes possible a significant reduction in device length without incurring the detrimental "short channel" effects seen with conventional transistor design, in addition to greatly reducing high electric field hot-electron effects);

Offset distance of source/drain implants are easily changed independently for N-channel and P-channel devices, allowing greater flexibility for device reoptimization when circuits are shrunk;

The N-channel and P-channel transistors can be independently controlled and optimized for best LDD performance and reliability (this fact allows maximum shrinkablity for subsequent generation products and reduces retooling for changes in N-channel or P-channel transistors);

It is compatible with contemporary IC fabrication equipment, and requires no exotic new equipment; and The reduced number of process steps and reduced mask count improves electrical sort yields, reduces manufacturing costs, increases productivity, reduces cycle times through fabrication, reduces total process inventory needed for a given run rate, allows more rapid response to process changes in volume quantities, and provides more products having less variation.

BRIEF DESCRIPTION OF THE DRAWINGS

The drawing Figures each show cross-sections of a portion of a semiconductor circuit device which utilizes the present invention.

DETAILED DESCRIPTION OF THE PREFERRED EMBODIMENT

Figure 1:
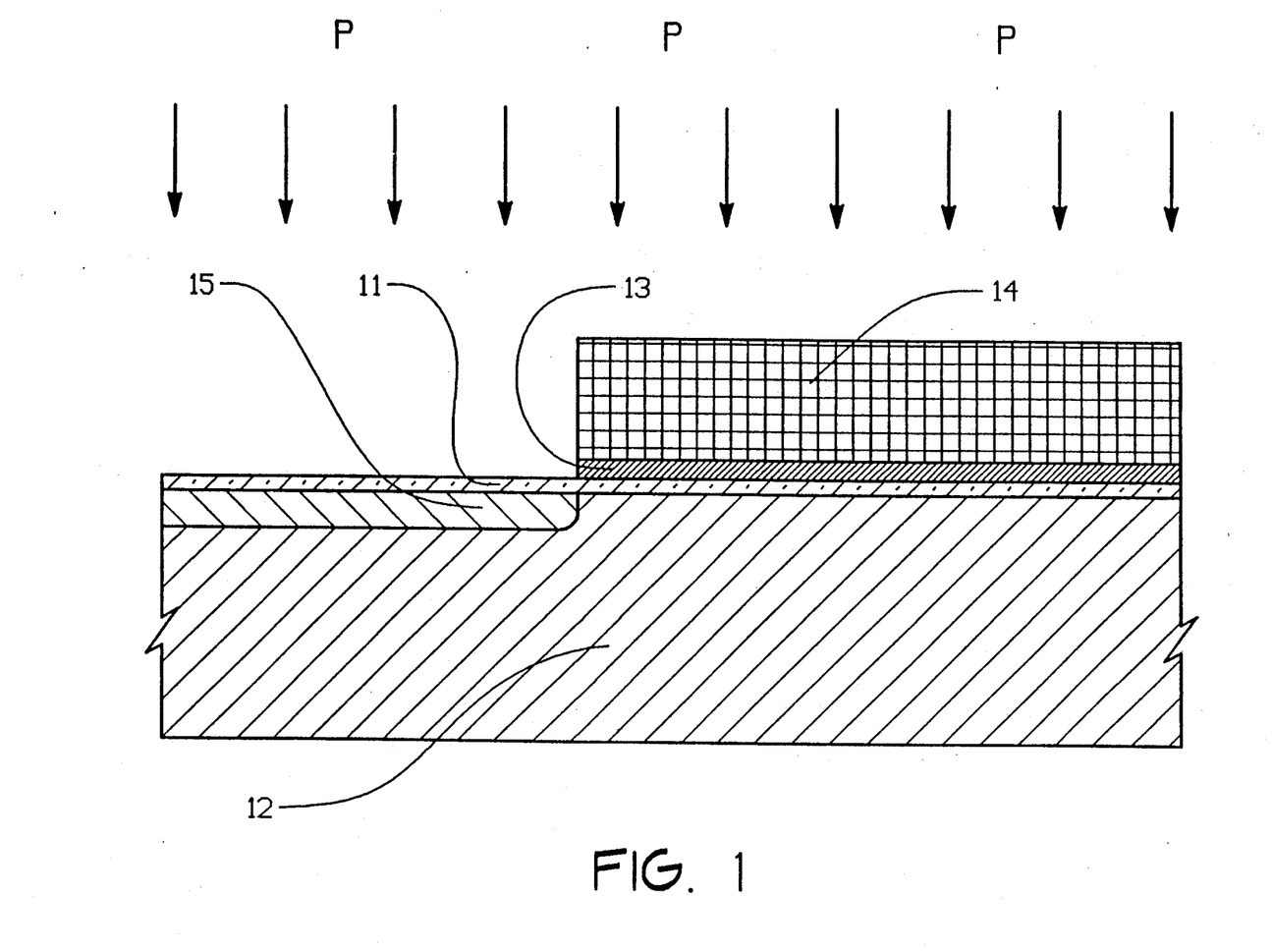
FIG. 1 shows a lightly-doped P-type silicon substrate being implanted with phosphorus to create a well of N-type silicon following the growth of a first layer of pad oxide, deposition of a first silicon nitride layer, masking of the first silicon nitride layer with a first photoresist mask and etching of the silicon nitride layer.

Referring now to FIG. 1, a first pad oxide layer 11 is grown on lightly-doped P-type silicon substrate 12. A first silicon nitride layer 13 is then deposited on top of first pad oxide layer 11, following which a first photomask 14 is used to expose only those regions on substrate 12 that are to receive a first phosphorus implant. The phosphorus implant creates N-well regions 15. (Only a single such region is shown in this figure.)

Figure 2:
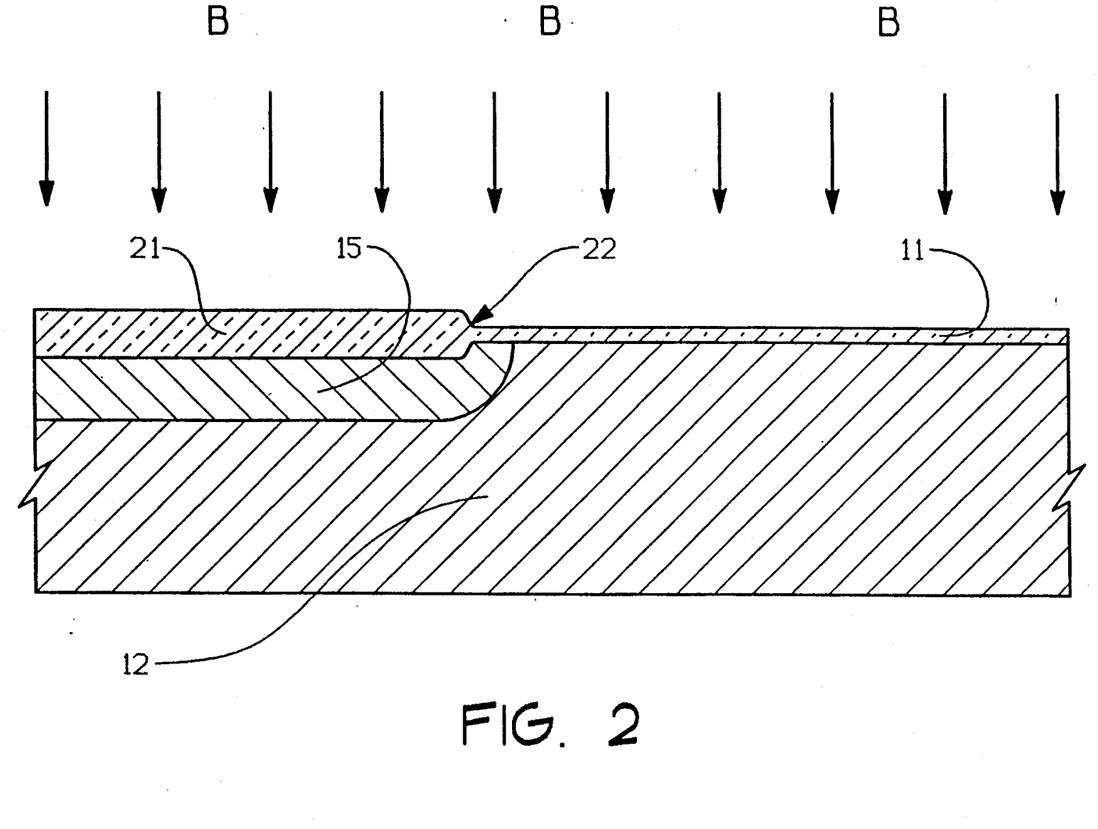
FIG. 2 shows the semiconductor device of FIG. 1 being subjected to an optional P-type substrate boron adjustment implant following a high temperature step which has caused the N-well phosphorus implant to diffuse into the substrate, oxidation of silicon in the N-well region where it was unprotected by the first nitride layer to create an oxide mask, and stripping of the first nitride layer.

Referring now to FIG. 2, following the stripping of the first photomask, a silicon dioxide masking layer 21 is grown in an oxidizing environment. The first pad oxide layer 11 acts to relieve stresses in the bird's beak region 22 at the edge of masking layer 21 during the oxide growth step. Following the stripping of first silicon nitride layer 13, the wafer is exposed to an optional boron adjustment implant which optimizes the concentration of P-type charge carriers in the substrate regions outside the N-well where N-channel devices will be created. Silicon dioxide masking layer 21 protects the N-well region from this boron adjustment implant. Next, the phosphorus atoms implanted in the N-well regions 15 and the boron atoms outside the N-well from the optional adjustment implant are driven into the substrate during a high-temperature step.

Figure 3:
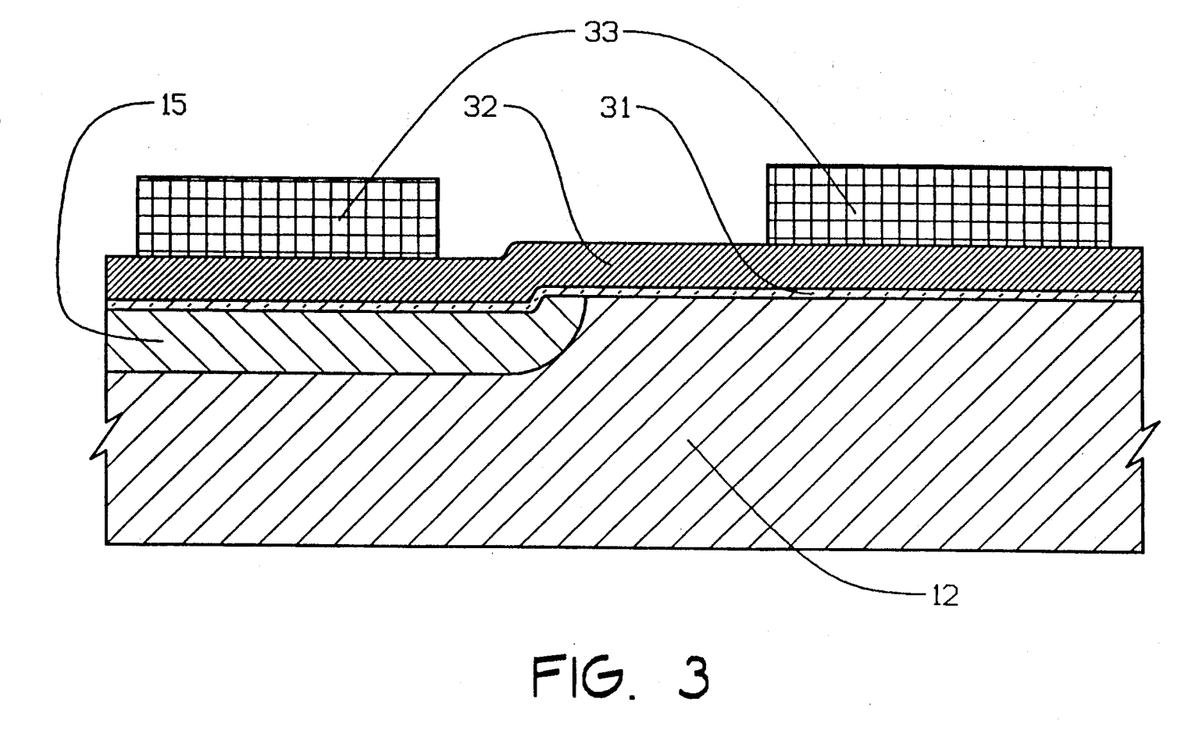
FIG. 3 shows the semiconductor device of FIG. 2 following the stripping of the oxide mask and first layer of pad oxide, growth of a second layer of pad oxide, deposition of a second layer of silicon nitride and masking of the second silicon nitride layer with a second photomask to define active areas.

Referring now to FIG. 3, following the stripping of silicon dioxide masking layer 21 and first pad oxide layer 11, a second pad oxide layer 31 is grown on the surface of the entire wafer. This is followed by the deposition of a second silicon nitride layer 32. A second photomask 33 defines active areas for both P-channel devices (those that will be constructed in the N-well) and N-channel devices.

Figure 4:
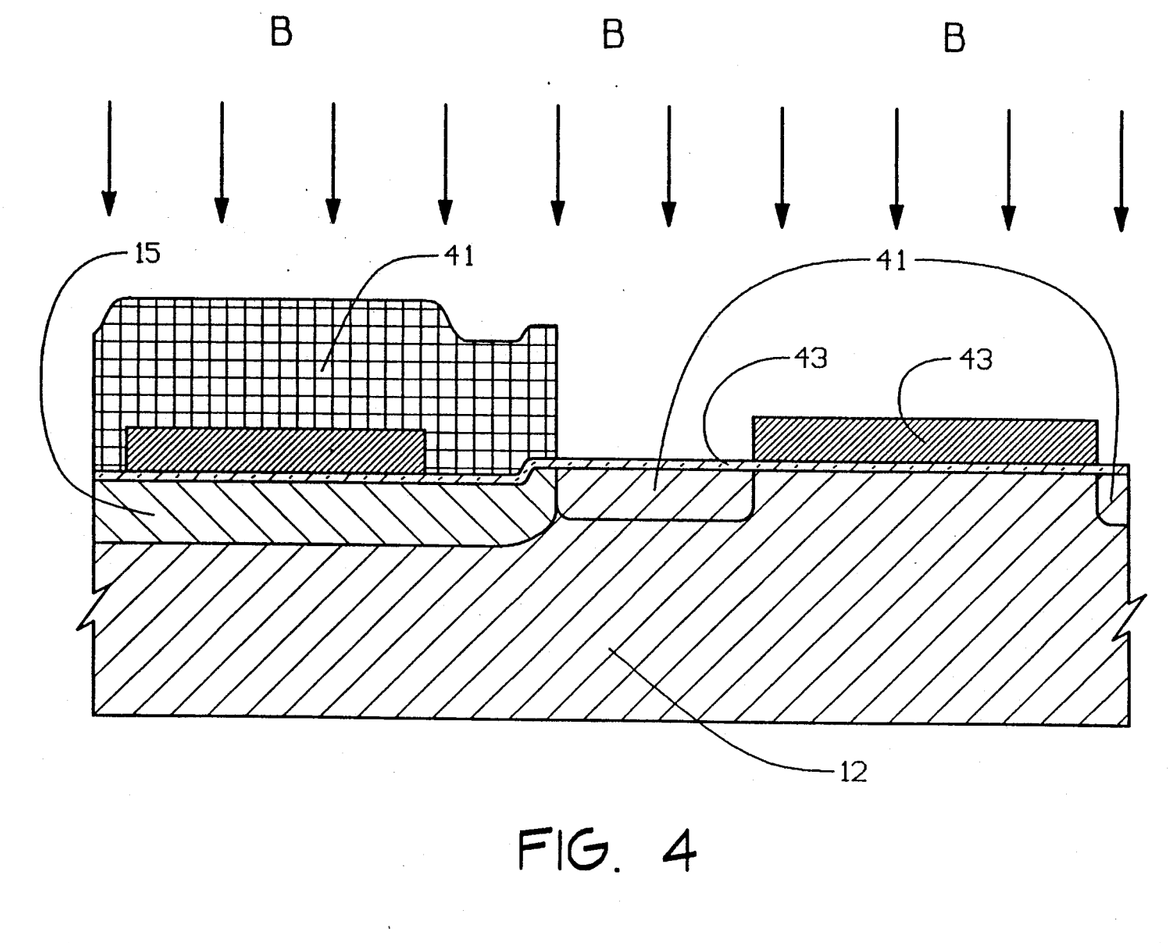
FIG. 4 shows the semiconductor device of FIG. 3 undergoing a field isolation boron implant with the N-well region masked with a third photomask following an etch of the second nitride layer.

Referring now to FIG. 4, following the etching of second nitride layer 32, the N-well regions are covered with a third photomask 41. The wafer is then subjected to a field isolation boron implant. During this step, boron atoms are implanted only in the N-channel field regions. Third photomask prevents the implantation of boron in the N-well field regions and the N-channel active area nitride mask 42 prevents the implantation of boron into the future N-channel active areas.

Figure 5:
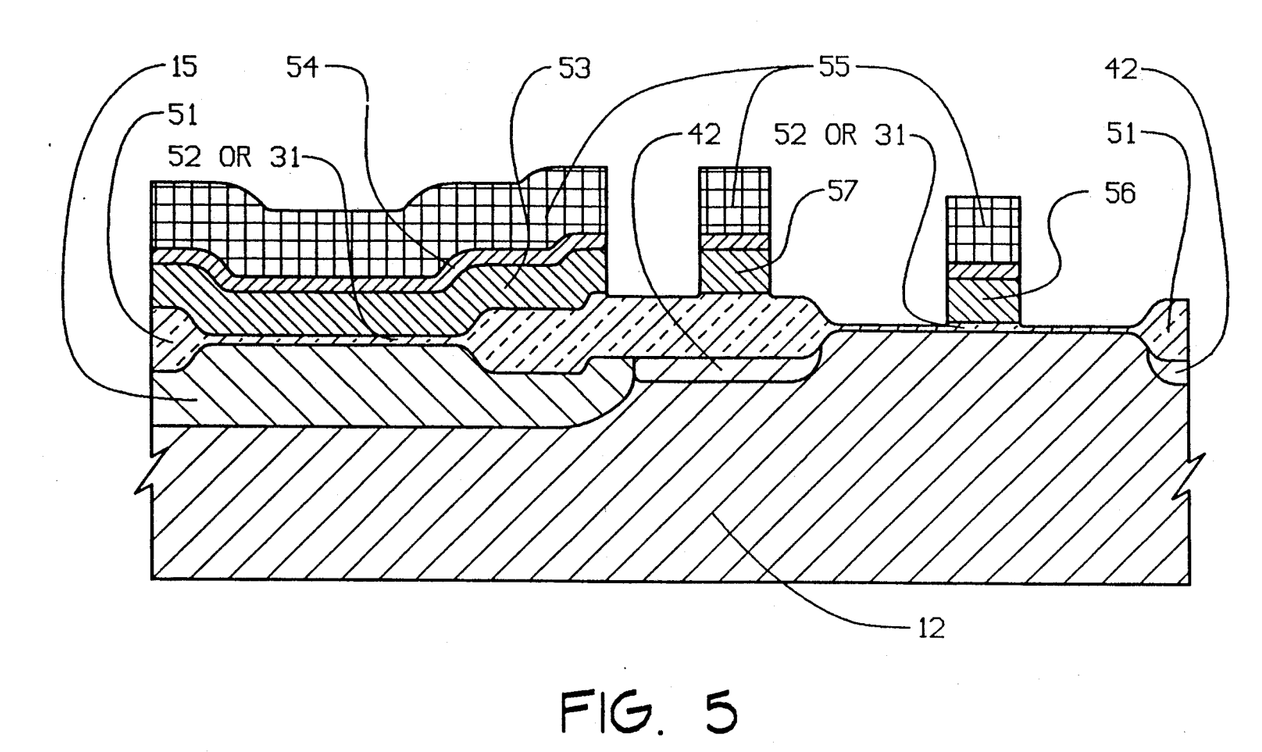
FIG. 5 shows the semiconductor device of FIG. 4 following the growth of field oxide using the LOCOS process, stripping of the second nitride layer, deposition of a polysilicon layer, creation of an optional tungsten silicide layer on top of the poly layer, masking of the tungsten silicide-coated poly layer with a fourth photomask, and a first etch of the silicide-coated poly layer to create gates and interconnects for N-channel devices and an unbroken layer of silicide-coated poly in the N-well regions.

Referring now to FIG. 5, following the stripping of third photomask 41 and growth of field oxide regions 51 using the conventional LOCOS oxidation process, second nitride layer 32 is stripped, as is second pad oxide layer 31. A layer of sacrificial oxide is then grown to eliminate the "white ribbon" effect in active areas that resulted from field oxidation. Following an unmasked $V_T$ implant which adjusts transistor threshold voltage, the sacrificial oxide layer is stripped and a gate oxide layer 52 is grown. Alternatively, second pad oxide layer 31 may be left intact in order to serve as transistor gate oxide in both N-channel and P-channel regions. The blanket deposition of a polysilicon layer 53 takes place next. After polysilicon layer 53 is doped with phosphorus to render it conductive, an optional tungsten silicide layer 54 may be deposited on top of polysilicon layer 53. The function of tungsten silicide layer 54 is to lower the sheet resistance of poly layer 53. A fourth photomask 55 is used to cover or blanket tungsten silicide-coated polysilicon layer 53 in the P-channel regions and to define N-channel transistor gates 56 and N-channel interconnects 57. The etch of optional tungsten silicide layer 54 and polysilicon layer 53, which follows the fourth photomasking step, also removes a small amount of the exposed portions of field oxide regions 51 and gate oxide layer 52 (or second pad oxide layer 31 if it is used as gate oxide).

Figure 6:
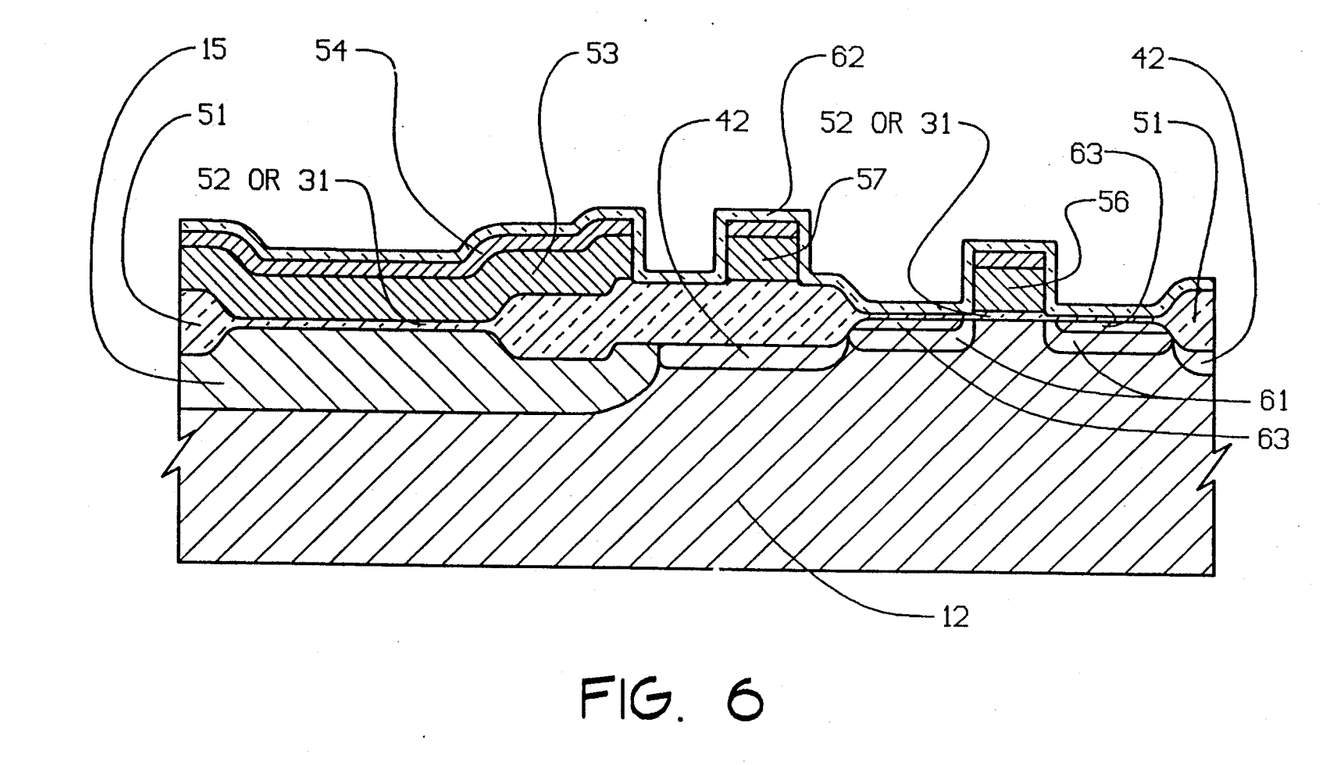
FIG. 6 shows the semiconductor device of FIG. 5 following the stripping of the fourth photomask, a self-aligned boron punch-through implant, thermal growth of a mini-spacer oxide layer, and a self-aligned low-dosage phosphorus N-source/drain implant.

Referring now to FIG. 6, following the stripping of fourth photomask 54, the wafer is subjected to an unmasked low-dosage boron implant, which serves as a N-channel punch-through voltage enhancement, creating punch-through implant regions 61 that extend to the edges of transistor gates 56. This is followed by a thermal oxidation or chemical vapor deposition (CVD) to create a mini-spacer oxide layer 62 having a thickness in the range of 300 to 1500 angstroms. The purpose of mini-spacer oxide layer 61 is to coat the sides of transistor gates 56, so that when the wafer is subjected to an unmasked low-dosage phosphorus implant, lightly-doped N— regions 63 are created in the active areas of the N-channel transistors, said N— regions being offset from the vertical boundaries of punch-through implant regions 61 by the vertical segments of mini-spacer oxide layer 62 on the edges of the N-channel transistor gates 56.

Figure 7:
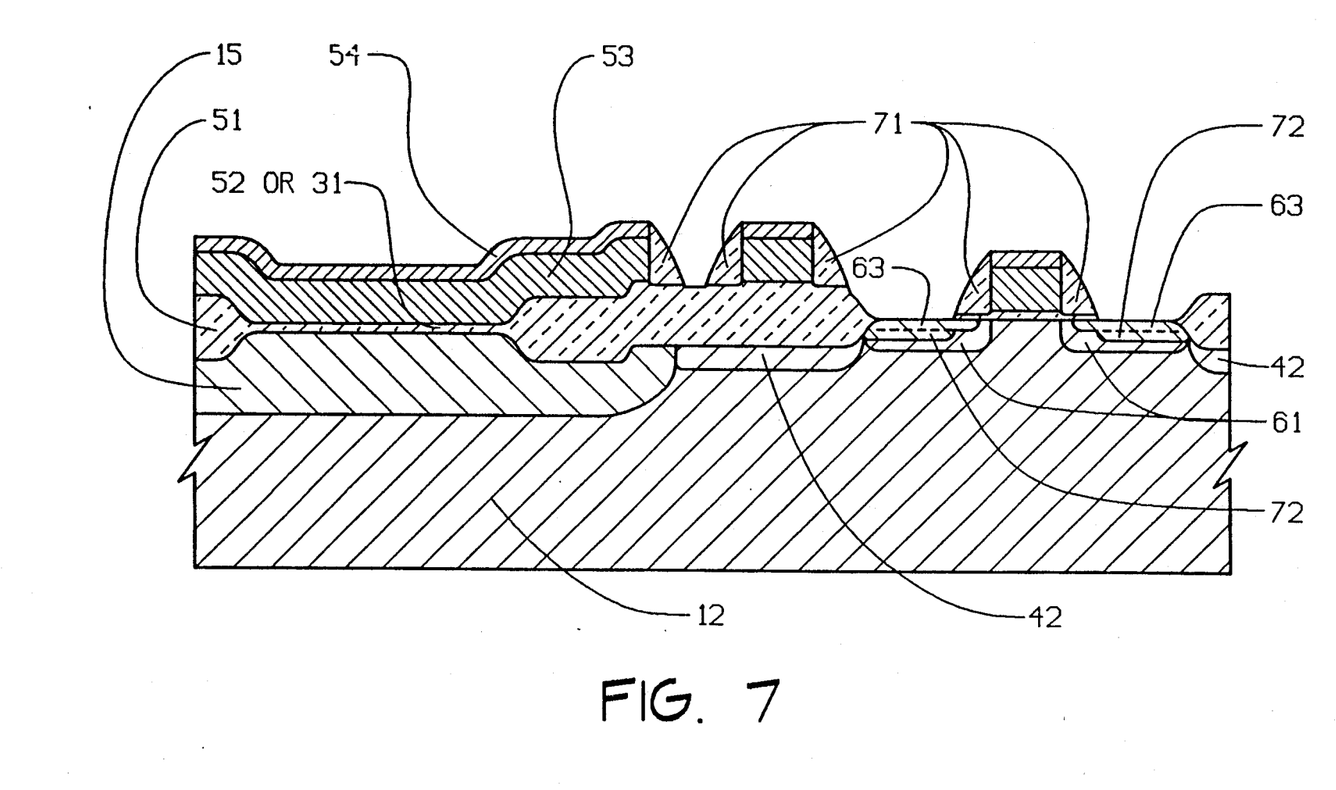
FIG. 7 shows the semiconductor device of FIG. 6 following the CVD deposition of a spacer oxide layer, an anisotropic etch followed by an optional isotropic etch of the spacer oxide layer to create spacers on each side of the N-channel devices, and a self-aligned arsenic N+ source/drain implant.

Referring now to FIG. 7, following the CVD deposition of an oxide spacer layer, an anisotropic etch and an optional isotropic etch (in that order) of the oxide spacer layer form oxide spacers 71 on the sides of the N-channel transistor gates 56, the N-channel interconnects 57 and the portion of polysilicon layer 53 which blankets the P-channel regions. The anisotropic etch is used to remove most of the spacer oxide layers, but not to the point where the substrate is cleared. The task of clearing the substrate is left to the wet etch, which can be made far more selective to silicon dioxide than to the substrate, thus minimizing silicon crystal damage on the substrate surface. An unmasked high-dosage arsenic or phosphorus implant then creates heavily-doped N+ regions 72 in the active areas of the N-channel transistors. This high-dosage implant is self-aligned to the edges of the oxide spacers 71.

Figure 8:
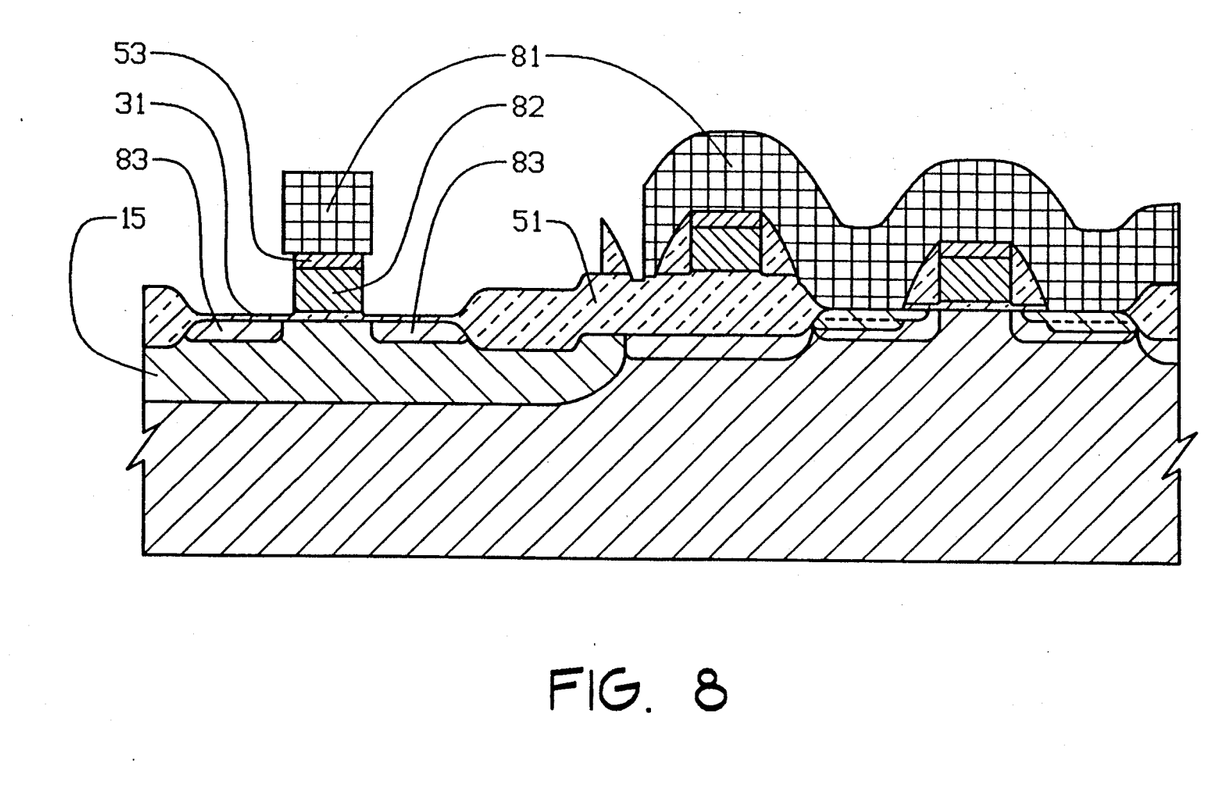
FIG. 8 shows the semiconductor device of FIG. 7 following a second etch of the silicide-coated poly layer using a fifth photomask which protects the already-formed N-channel devices and patterns the gates of P-channel devices.

Referring now to FIG. 8, the next step in the improved CMOS process is the masking of the wafer with a fifth photomask 81 which covers or blankets the already-formed N-channel devices and defines P-channel transistor gates 82 and interconnects (not shown in this Figure). The isotropic etch used to pattern tungsten silicide-coated polysilicon layer 53 produces P-channel gates and interconnects that are slightly undercut (recessed under the patterning segments of fifth photomask 81. Following the creation of P-channel transistor gates 82 and interconnects, a high-dosage boron implant creates drain and source regions 83 for the P-channel transistors. The fact that the edges of P-channel gates 82 are undercut beneath the edges of fifth photomask 81 spaces the high-dosage boron implant array from the gate edges so that subsequent high-temperature drive steps do not result in excessive P+ region-to-gate overlap. With the stripping of fifth photomask 81, N-channel and P-channel transistor formation is complete.

Figure 9:
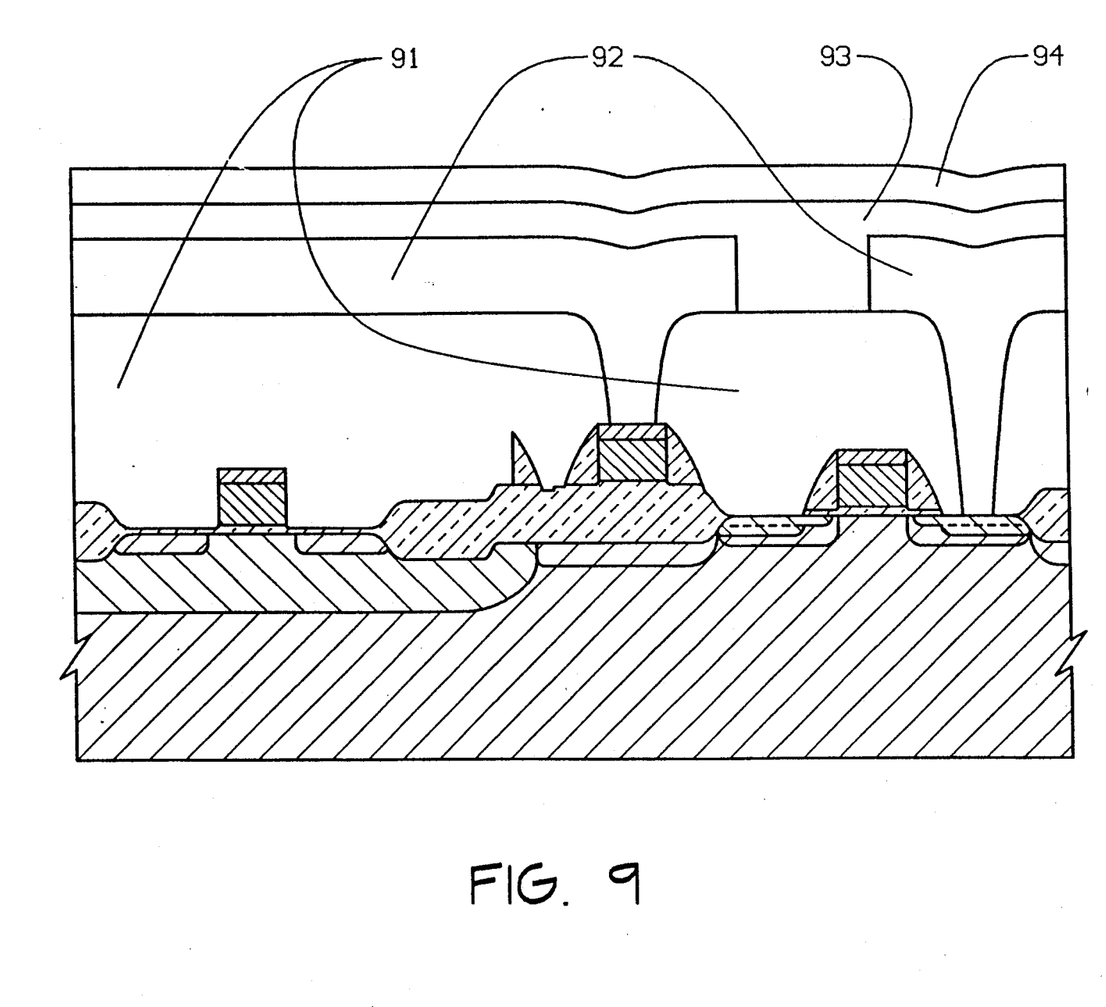
FIG. 9 shows the semiconductor device of FIG. 8 completed using conventional processing technology.

Referring now to FIG. 9, conventional processing technology is used to complete the circuitry. All structures have been covered by an oxide isolation layer 91, which may be doped with phosphorus, boron or both. A sixth photomask (not shown) has been used to define contact vias through oxide isolation layer 91 through which connection to the poly structures or active area conductive regions below can be made. As an aluminum metal layer 92 is deposited, the aluminum metal layer forms on the sidewalls and bottom of each via, making contact with poly structures or active area conductive regions below. Aluminum metal layer 92 is masked with a seventh photomask (not shown), which is used to create circuit interconnects. Deposition of a first passivation layer 93 is followed by the deposition of a second passivation layer 94. After an eighth photomask is used to define bonding pad openings in the passivation layer which expose bonding pad regions on aluminum layer 92 below, the split-polysilicon CMOS process is complete.

Although only a single embodiment of the improved CMOS process has been described herein, it will be apparent to one skilled in the art that changes and modifications may be made thereto without departing from the spirit and the scope of the invention as claimed. For example, the same process flow could be used to create P-channel and N-channel devices on a lightly-doped N-type substrate (arsenic or phosphorus-doped silicon having a conductivity opposite to that of the lightly-doped P-type substrate used to begin the process described in detail heretofore). In such a case, a P-well, rather than an N-well would be created in the substrate, and so forth. Furthermore, the same process approach as heretofore explained in the context of a single conductive gate layer application could also be applied to more complex CMOS process such as multi-level polysilicon and/or multi-level metal applications.

We claim:

1. An improved process sequence for the fabrication of CMOS integrated circuits on semiconductor material having both N-type material regions and P-type material regions, each of which is covered by a gate dielectric layer, said process sequence comprising the following sequence of steps:

(a) blanket deposition of a conductive layer on top of the gate dielectric layer;

(b) masking of said conductive layer with a first photomask which, in P-type material regions, defines N-channel gates and interconnects and in N-type material regions, blankets said conductive layer;

(c) removing exposed portions of said conductive layer and underlying portions of the gate dielectric layer with a first etch to form N-channel gates and interconnects;

(d) stripping of said first photomask;

(e) implant of a P-type conductivity-creating impurity self-aligned to said N-channel gates which functions as a punch-through implant, the conductive layer masking the N-type material regions from P-type impurities;

(f) oxidation of all exposed silicon to create a mini-spacer oxide layer in exposed N-channel source and drain regions and on the sides of N-channel transistor gates;

(g) low dosage implant of an N-type conductivity-creating impurity to create lightly-doped drain and source regions self-aligned to said mini-spacer oxide layer, the conductive layer masking the N-type material regions from N-type impurities;

(h) blanket deposition of a silicon dioxide layer;

(i) anisotropic etching of said silicon dioxide layer to create transistor gate spacers;

(h) high-dosage implanting of an N-type conductivity-creating impurity to create heavily-doped drain and source regions self-aligned to said spacers, the conductive layer masking the N-type material regions from N-type impurities;

(k) using a second photomask to blanket the P-type material regions and to define the P-channel gates and interconnects in the N-type material regions;

(l) removing exposed portions of said conductive layer and underlying portions of the gate dielectric layer with a second etch to form P-channel gates and interconnects; and (m) high-dosage implanting of a P-type conductivity-creating impurity to create heavily-doped drain and source regions self-aligned to portions of the second photomask which defines said P-channel gates; and (n) removing said second photomask.

2. The improved CMOS fabrication process sequence of claim 1, wherein said gate dielectric layer is comprised of silicon dioxide.

3. The improved CMOS fabrication process sequence of claim 1, wherein said oxidation of all exposed silicon to create a mini-spacer oxide layer is replaced by a mini-spacer oxide layer blanket deposition step.

* * * * *